United States Patent [19]

Siemon et al.

[11] Patent Number: 5,598,342
[45] Date of Patent: Jan. 28, 1997

[54] CABLE TESTER

[75] Inventors: John A. Siemon, Woodbury; Martin Green, Shelton; Frank Sundermeyer, Prospect, all of Conn.

[73] Assignee: The Siemon Company, Watertown, Conn.

[21] Appl. No.: 382,231

[22] Filed: Jan. 31, 1995

[51] Int. Cl.$^6$ ........................................... G01R 1/04
[52] U.S. Cl. .................... 364/481; 364/482; 364/483; 439/66
[58] Field of Search ..................... 364/550, 480, 364/481, 482, 483; 439/66, 350; 324/66

[56] References Cited

U.S. PATENT DOCUMENTS

| | | | |
|---|---|---|---|
| 3,986,106 | 10/1976 | Shuck et al. | 324/51 |
| 4,932,888 | 6/1990 | Senor | 439/108 |
| 5,004,430 | 4/1991 | DelGuidice et al. | 439/350 |
| 5,092,774 | 3/1992 | Milan | 439/66 |
| 5,281,169 | 1/1994 | Kiat et al. | 439/607 |
| 5,492,481 | 2/1996 | Lewis | 439/159 |

OTHER PUBLICATIONS

Specialized Products Company, 1993 Advertising Literature.
Fluke LAN CableMapper Advertising Literature.
Netscan 100 Advertising Literature.
Netscan 2000 Advertising Literature.

Primary Examiner—Ellis B. Ramirez
Assistant Examiner—Demetra R. Smith
Attorney, Agent, or Firm—Fishman, Dionne & Cantor

[57] ABSTRACT

A master control unit of a cable tester in accordance with the present invention comprises a housing having an upper portion and a lower portion. The master control unit includes a display, a pivotal cover, an indicator, a modular jack, and an activation/selection button. Electronics of the cable tester are disposed with the housing. A remote unit compatible with standard modular jacks comprises a housing for supporting a printed circuit board and a cover. The housing comprises an elongated generally rectangular portion which is sized so as to be compatible with standard modular jacks. During use the master control unit is connected by a jumper cable to a modular jack under test. The modular jack under test is connected by wiring to another modular jack, also under test, at another location. The remote unit is inserted into and mates with the other modular jack. Testing is performed at master control unit. The master control unit includes display indications for low battery and for the presence of line voltage at the display. The switch is used to index through the test modes. The indicator lights each time the button is pushed, with each screen change, during testing, and remains lit to indicate a pass condition.

41 Claims, 15 Drawing Sheets

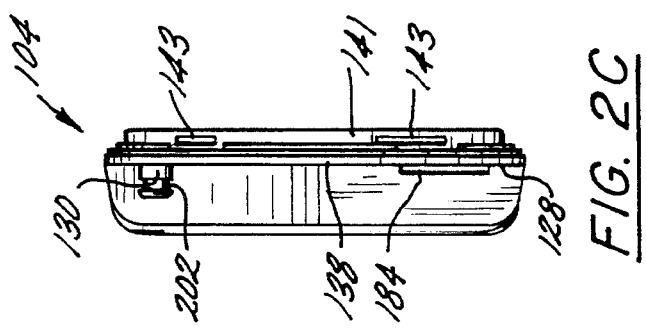
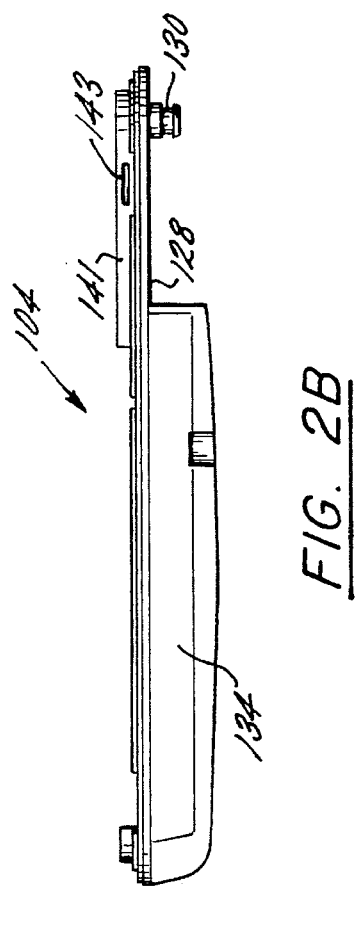
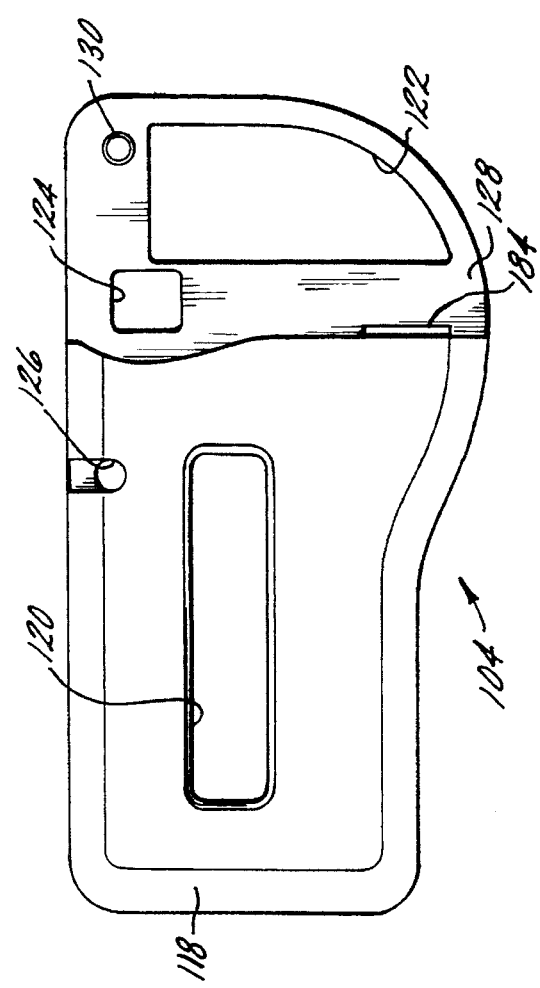

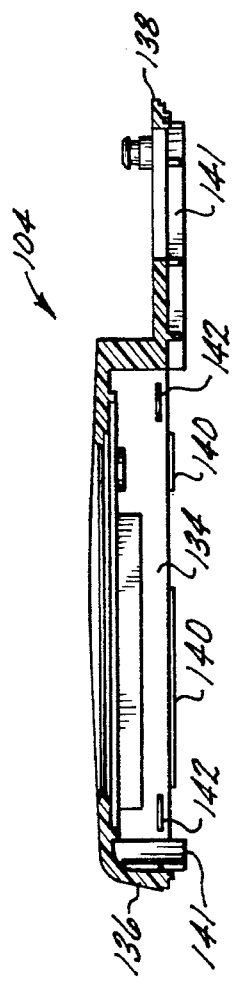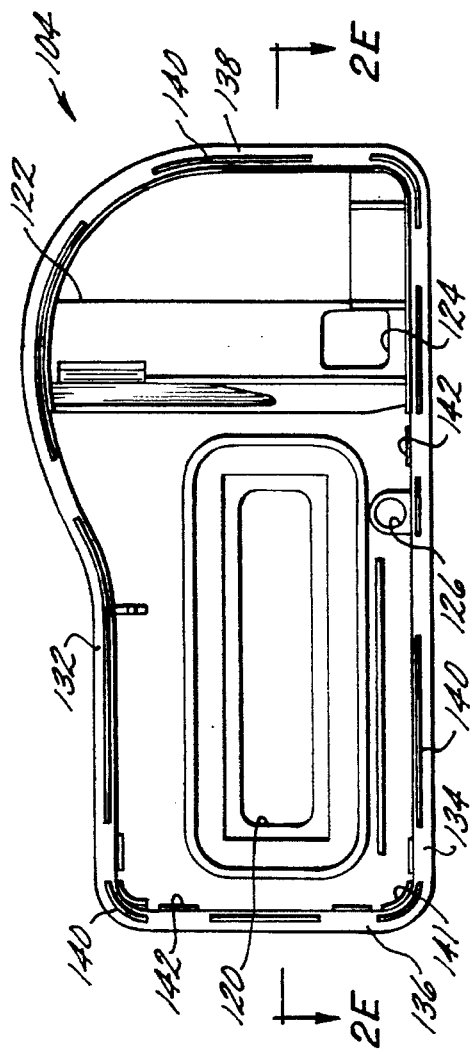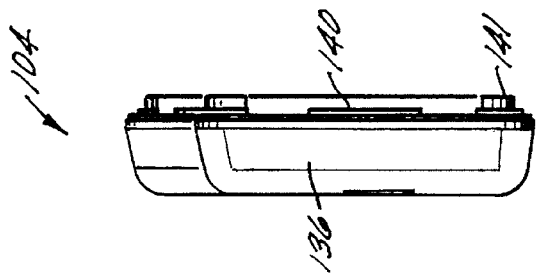

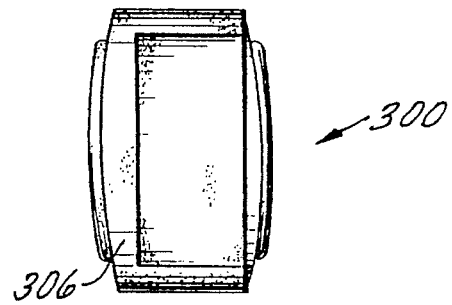
FIG. 8D
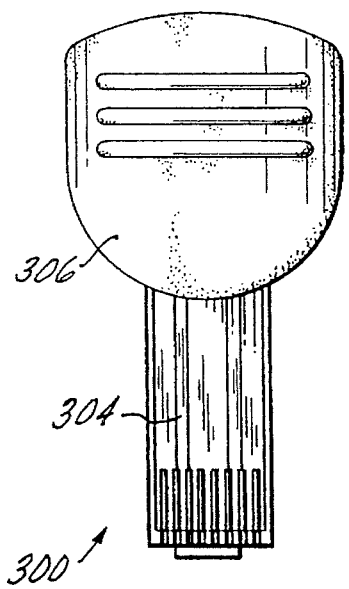 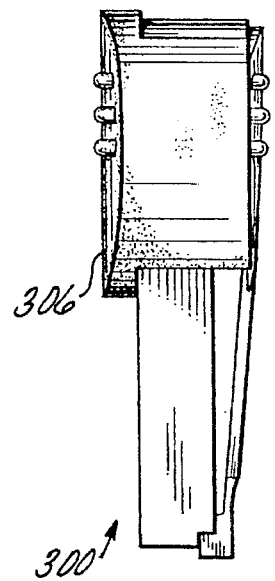 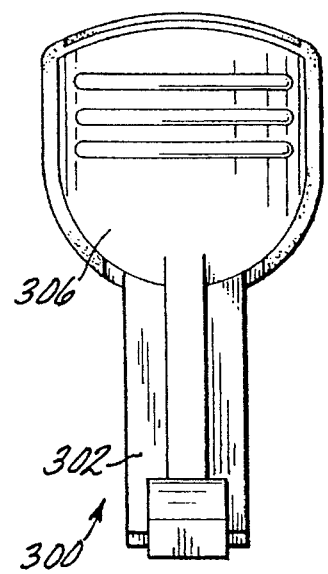
FIG. 8E　　FIG. 8B　　FIG. 8A
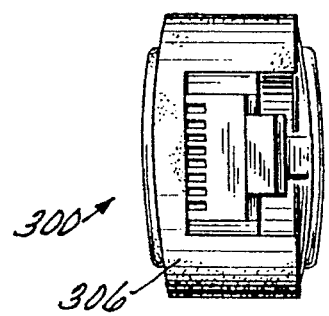
FIG. 8C

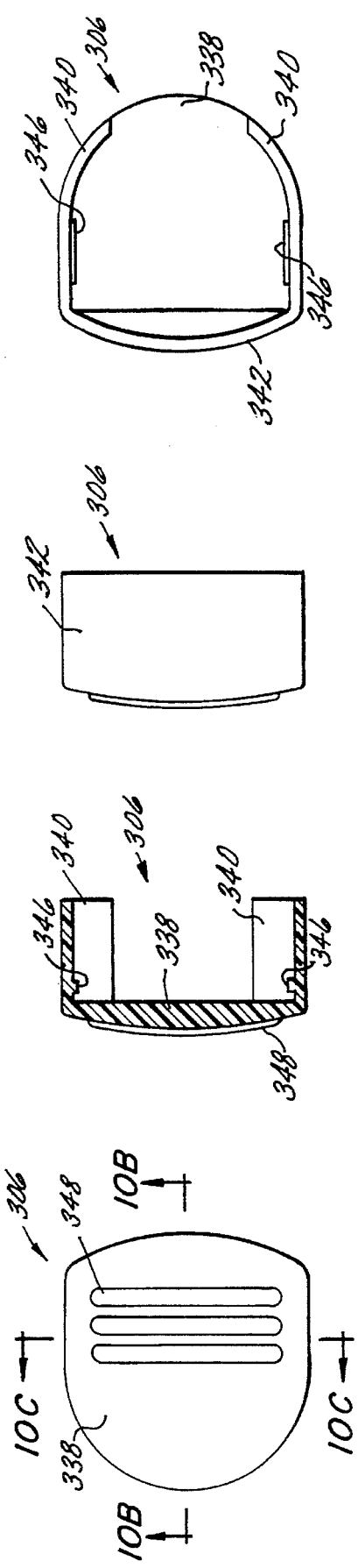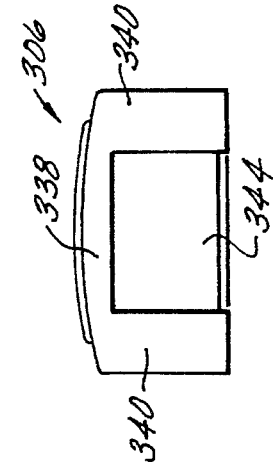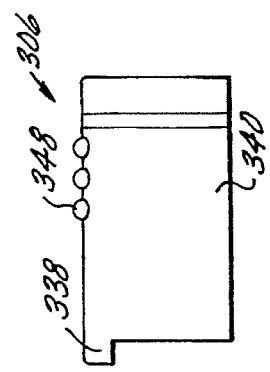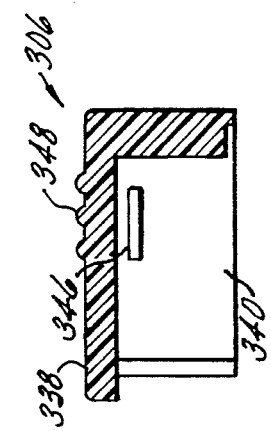

CABLE TESTER

BACKGROUND OF THE INVENTION

The present invention relates to cable testers. More specifically, the present invention relates to a microprocessor based cable tester capable of testing and detecting a plurality of standard wiring configurations or schemes.

Cable testers are known and widely used for testing wiring installations. Such cable testers; test continuity, identify common twisted-pair wiring faults for selected standard wiring configurations or schemes. Such cable testers aid in identifying and correcting wiring errors and faults. A continuing need exists for cable testers to provide more information in a manner that an installer or user can quickly verify a wiring scheme or identify a fault or error and initiate a repair thereof.

SUMMARY OF THE INVENTION

The above discussed and other drawbacks and deficiencies of the prior art are overcome or alleviated by the cable tester of the present invention. In accordance with the present invention, the cable tester comprises a master control unit and a remote unit.

The master control unit compring a housing having an upper portion and a lower portion. The master control unit includes a display, a pivotal cover, an indicator, a modular jack, and an activation/selection button. Electronics of the cable tester are disposed with the housing.

The upper housing portion comprises a generally rectangularly shaped upper member having an opening for viewing of the display, an opening for providing access to a battery, an opening for providing access for the button and an opening for viewing of the indicator. The upper member further-comprises a stepped down portion for receiving the cover and a post for pivotally retaining the cover thereon. While, the upper member is generally rectangularly shaped a portion thereof is flared outwardly.

The lower housing portion comprises a generally rectangularly shaped lower member having a lower bulging portion and a flared outwardly portion. The upper and lower housing portions are aligned and snap locked together by corresponding tabs and recesses. One side of the lower member has a notch therein for providing access to the modular jack. A loop is defined at one end of the lower member to provide attachment of the unit to a strap or the like, if so desired.

The cover comprises a cover member shaped to be received in stepped down portion of the upper member. The cover member includes a snap locking tab having an engagement ridge depending from one end thereof which is received in an opening of the upper member for holding the cover in its closed position. A button stem is integrally defined in the cover for activating the master control unit. The post from upper housing portion is received in a cavity of the cover for pivotally retaining the cover on the housing.

A printed circuit board having electronics mounted thereon is disposed in the housing. The display is mounted to standoffs which are attached to the circuit board for positioning the display in alignment with the opening in the upper housing portion when the unit is assembled. The modular jack and indicator are also mounted to the circuit board. An electronic switch is mounted to the circuit board and positioned to be actuated by depressing the button on the cover when the unit is assembled.

The remote unit is compatible with standard modular jacks and comprises a housing for supporting a printed circuit board and a cover. The housing comprises an elongated generally rectangular portion which is sized so as to be compatible with standard modular jacks. Depending from one end of the rectangular portion is an enlarged rounded portion for gripping of the remote unit during insertion and removal from standard modular jacks. A latching tab is mounted at one end of the rectangular portion for engaging the modular jack into which the remote unit is inserted during test. A plurality of spaced apart channels are defined by a plurality of spaced apart teeth at the end of the rectangular portion which is inserted into the modular jack during testing. The channels are sized and spaced for receiving contacts of a standard modular jack. A plurality of ridges are formed at the outer surface of the rounded member to facilitate gripping thereof during insertion and removal of the remote unit. A pair of slots are provided in the housing for retaining the cover.

The cover comprises a member having a generally rounded shape conforming to the rounded portion of the housing. A pair of protrusions depend inwardly from walls of the cover and are received in the slots of the housing to retain the cover thereon. A plurality of ridges may be formed at the outer surface of the cover to facilitate gripping thereof during insertion and removal of the remote unit.

The circuit board includes a first portion which is tapered down to a second portion. Electronic components are mounted on the circuit board at one side thereof, which faces the housing when attached thereto, whereby electronic components are not exposed in the fully assembled remote unit. The circuit board includes a plurality of contacts which correspond in position (location) and number with the channels for receiving contacts of a standard modular jack.

During use the master control unit is connected by a jumper cable to a modular jack under test. The jumper cable comprises a cable having a plurality of conductors with modular plugs at each end thereof. One of the modular plugs is mated with the modular jack under test. The other modular plug is mated with the modular jack at the master control unit. The modular jack under test is connected by wiring to another modular jack, also under test, at another location. The remote unit is inserted into and mates with the other modular jack. Testing is performed at master control unit.

The master control unit includes display indications for low battery (e.g., LOW BATT) and for the presence of line voltage (e.g., alternately flashing LINE VOLTAGE) at the display. The switch (i.e., mode switch) is used to index through the test modes. The indicator lights each time the button is pushed, with each screen change, during testing, and remains lit to indicate a pass condition.

The test mode can only be changed during display of a mode setting (e.g., T568A). After completion of a test mode, the unit pauses on the mode setting display, e.g., for a few seconds, before continuing, allowing selection of an alternative mode. During a test, pressing the button will suspend the test sequence and hold the current display, pressing the button again will resume operation. The button is also used to turn the master control unit on. Manual off is selected by the button as a display selection.

In Test and Find modes of operation, the master control unit operates continuously. The master control unit operates in four separate modes; Test (six settings), Find (one setting), Tone (eight settings) and Talk Bat (one setting). When one of the modes of operation is selected, the unit pauses, then commence operation. In the Test and Find modes the master control unit first identifies the remote unit attached at the far end then continues operation. In any other mode of operation, except for Find, if a test fails the DC portion, the master control unit will not continue with transmission testing. In the Find mode of operation the master control unit will perform transmission testing regardless of DC results.

The master controller perform a continuity test and a transmission (i.e., cross talk) test, and displays the results of these tests.

For all wiring schemes, with the exception of USOC, if the test comes up with all 'C's and all 'T's, the master control unit will display PASS at the end of the test sequence. For USOC, a PASS indication is designated with either 1-PAIR, 2-PAIR, 3-PAIR, or 4-PAIR, provided that the wiring corresponds exactly to one of the four USOC schemes.

If the indications R, S, ? or X appear at any time during the test, the master control unit will display FAIL CNT or FAIL TRN at the end of the test sequence. An open wire will not necessarily lead to a FAIL indication when testing for USOC pair schemes. FAIL indications are displayed longer than PASS indications.

Once a PASS or FAIL indication appears, the master control unit automatically recycles, starting with an indication of the wiring scheme under test and pausing.

When the wiring scheme under test is not known, the Find mode is selected to determine which pair scheme a circuit under test is wired to. The Find mode uses DC and transmission data to identify one of the following wiring schemes T568, 1-PAIR/USOC, 2-PAIR/USOC/TOK-RING, 3-PAIR/USOC or 4-PAIR/USOC, 10BASE-T and TP-PMD. Token ring (TOK-RING) is the same as 2-pair USOC (2-PAIR/USOC). DC and transmission testing is completed before a distinction between wiring schemes is made, e.g., transmission testing is completed before the master control unit can distinguish between 4-PAIR/USOC and T568.

If none of the standard wiring schemes is detected, but at least one of the six standard pairs (i.e., pins 4 & 5, 3 & 6, 1 & 2, 7 & 8, 2 & 7 or 1 & 8) is detected, the master control unit sequentially displays PNXX for each correctly wired pair grouping detected. If no standard pair grouping is detected (e.g., if continuity exists on pins 1 and 3 only), the master control unit displays NONE.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIGS. 1A–F are views of the master control unit in accordance with the present invention wherein FIG. 1A is a top view thereof, FIG. 1B is a first side view thereof, FIG. 1C is a first end view thereof, FIG. 1D is a second end view thereof, FIG. 1F is a second side view thereof, and FIG. 1E is a bottom view thereof;

FIGS. 2A–F are views of the upper housing portion of the mater control unit of FIGS. 1A–F wherein FIG. 2A is a top view thereof, FIG. 2B is a first side view thereof, FIG. 2C is a first end view thereof, FIG. 2D is a bottom view thereof, FIG. 2E is a cross section view along the line 2E—2E in FIG. 2D, and FIG. 2F is a second end view thereof, FIGS. 3A–G are views of the lower housing portion of the mater control unit of FIGS. 1A–F wherein FIG. 3A is a bottom view thereof, FIG. 3B is a first side view thereof, FIG. 3C is a first end view thereof, FIG. 3D is a second side view thereof, FIG. 3E is a top view thereof, FIG. 3F is cross section view along the line 3F—3F in FIG. 3E, and FIG. 3G is a second end view thereof, FIGS. 4A–E are views of the cover of the mater control unit of FIGS. 1A–F wherein FIG. 4A is a top view thereof, FIG. 4B is a first side view thereof, FIG. 4C is a first end view thereof, FIG. 4D is a bottom view thereof, and FIG. 4E is a cross section view along the line 4E—4E in FIG. 4D;

FIGS. 5A–C are view of the electronics unit of the mater control unit of FIGS. 1A–F wherein FIG. 5A is a top view thereof, FIG. 5B is a side view thereof, and FIG. 5C is an end view thereof, FIGS. 6A–B are exploded views of the mater control unit of FIGS. 1A–F wherein FIG. 6A is a side view thereof, and FIG. 6B is an end view thereof;

FIGS. 8A–E are views of the remote unit in accordance with the present invention wherein FIG. 8A is a bottom view thereof, FIG. 8B is a first side view thereof, FIG. 8C is a first end view thereof, FIG. 8D is a second end view thereof, and FIG. 8E is a top view thereof;

FIGS. 9A–E are views of the housing of the remote unit of FIGS. 8A–E wherein FIG. 9A is bottom view thereof, FIG. 9B is a first side view thereof, FIG. 9C is a first end view thereof, FIG. 9D is a top view thereof, and FIG. 9E is a second end view thereof;

FIGS. 10A–G are views of the cover of the remote unit of FIGS. 8A–E wherein FIG. 10A is a top view thereof, FIG. 10B is a cross section view along the line 10B—10B in FIG. 10A, FIG. 10C is a cross section view along the line 10C—10C in FIG. 10A, FIG. 10D is a first end view thereof, FIG. 10E is a first side view thereof, FIG. 10 F is a bottom view thereof, and FIG. 10G is a second end view thereof;

FIGS. 11A–E are views of the circuit board of the remote unit of FIGS. 8A–E wherein FIG. 11A is a bottom view thereof, FIG. 11B is an end view thereof, FIG. 11C is a side view thereof, FIG. 11D it a top view thereof, and FIG. 11E is an enlarged view of circle 11E in FIG. 11D;

DESCRIPTION OF THE PREFERRED EMBODIMENT

Figure 1F:
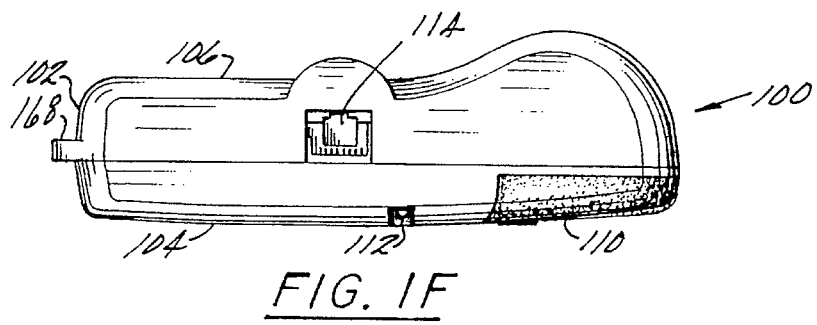
Figure 1A:
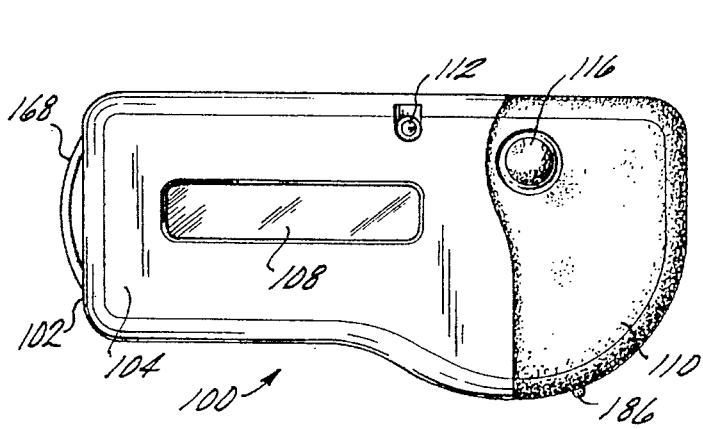
Figure 1D:
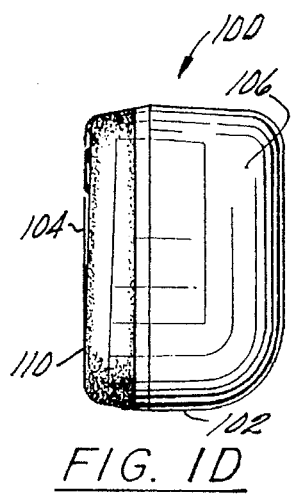
Figure 1B:
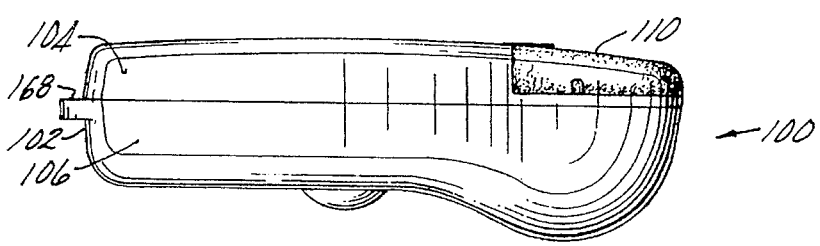
Figure 1C:
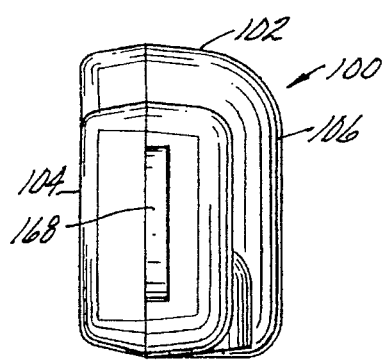
Figure 1E:
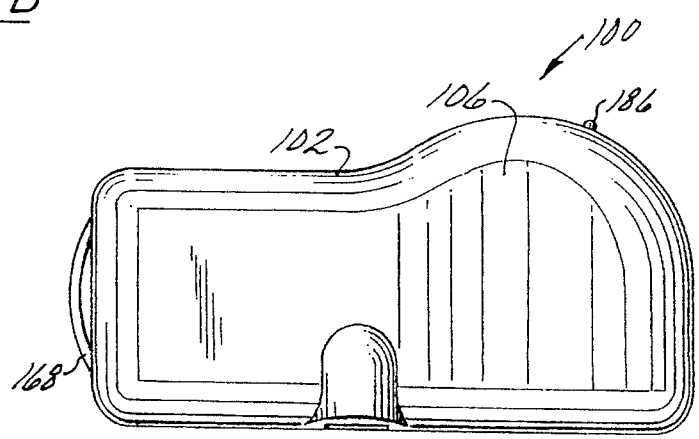
Figure 3A:
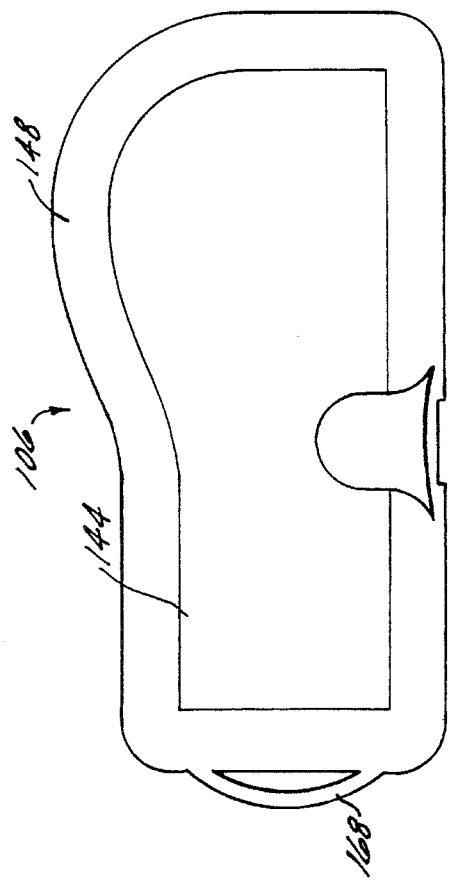
Figure 3B:
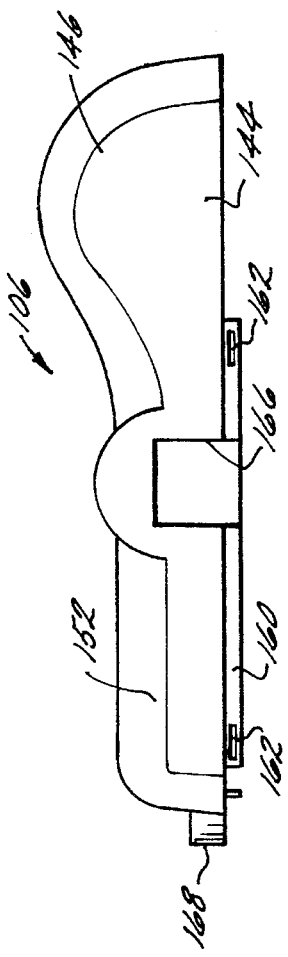
Figure 3C:
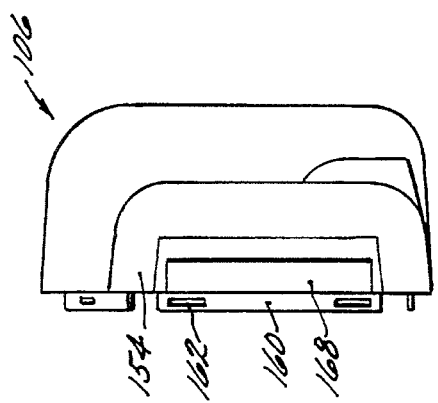
Figure 3G:
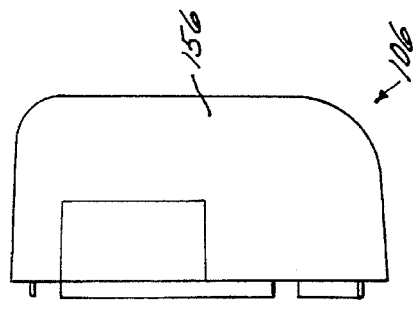
Figure 3E:
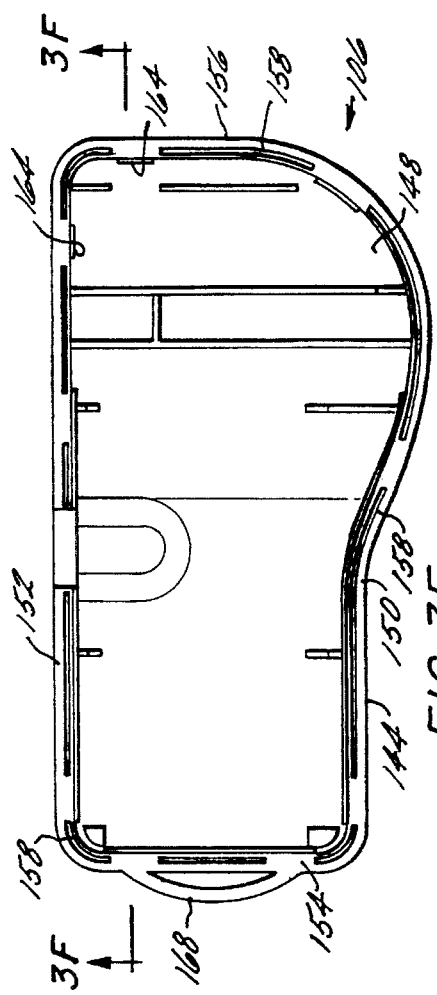
Figure 3F:
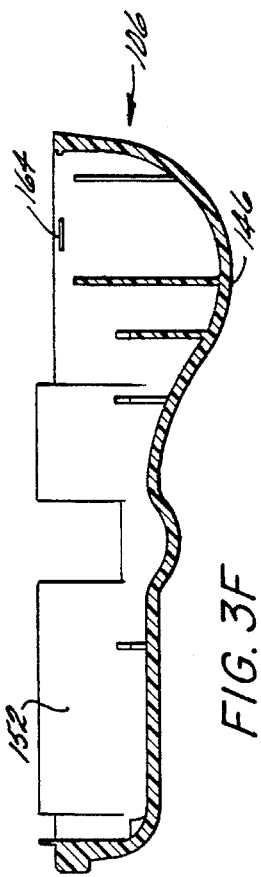
Figure 3D:
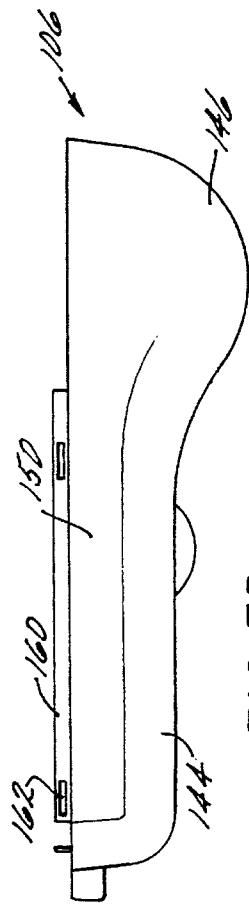
Figure 4D:
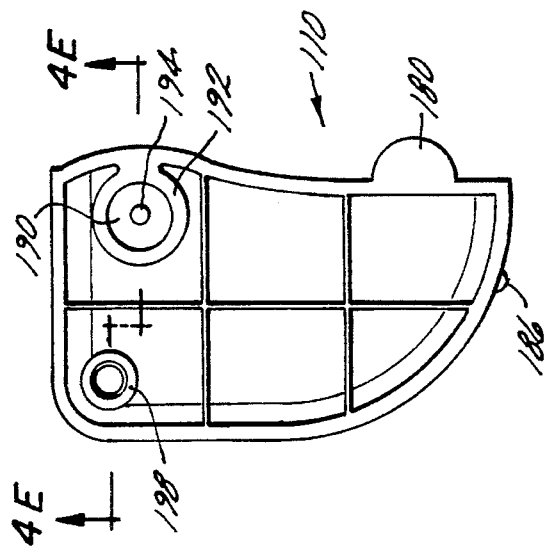
Figure 4E:
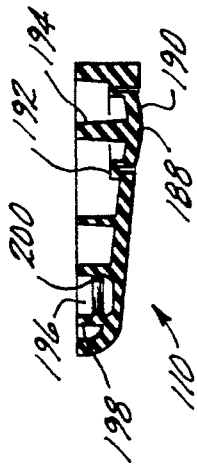
Figure 4C:
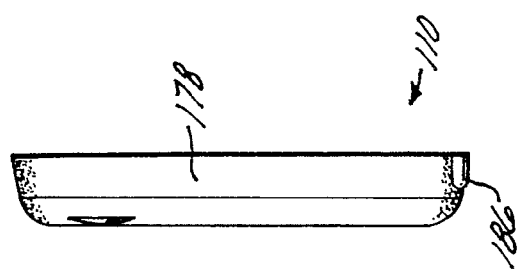
Figure 4A:
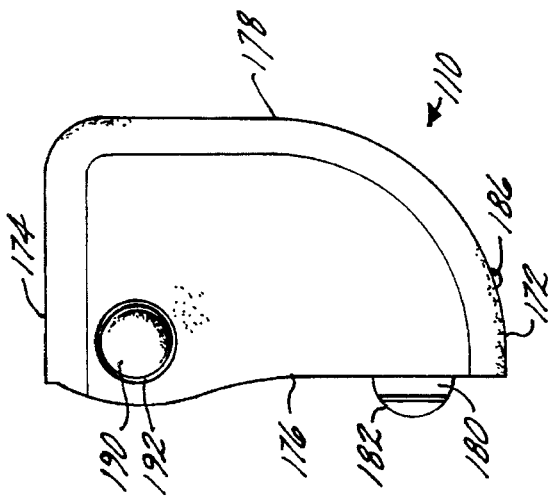
Figure 4B:
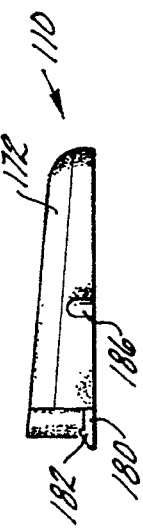

Referring to FIGS. 1A–F, a master control unit of a cable tester in accordance with the present invention is shown generally at 100. Control unit 100 comprises a housing 102 having an upper portion 104 and a lower portion 106. Housing portions 104 and 106 are preferably comprised of a plastic material, such as polycarbonate. Control unit 100 further includes a display 108 (e.g., a liquid crystal display), a pivotal cover 110, an indicator 112 (e.g., a light emitting diode), a modular jack 114, and an activation/selection button 116. Electronics of the cable tester are disposed with housing 100.

Referring to FIGS. 2A–F, upper housing portion 104 is generally shown. Portion 104 comprises a generally rectangularly shaped member 118 having an opening 120 for viewing of display 108, an opening 122 for providing access to a battery (discussed hereinafter), an opening 124 for providing access for button 116 and an opening 126 for viewing of indicator 112. Member 118 further comprises a stepped down portion 128 for receiving cover 110 and a post 130 for pivotally retaining cover 110 on portion 104. Member 118 includes downwardly extending sides 132, 134, downwardly extending end 136, and end 138. A plurality of alignment protrusions 140, 141 depend from sides 132, 134 and ends 136, 138. Protrusions 141 have a plurality of snap locking recesses 143 therein. Also, a plurality of snap locking engagement tabs 142 extend inwardly from sides 132, 134 and ends 136, 138. While, member 118 is generally rectangularly shaped a portion thereof is flared outwardly, as is clearly shown in the FIGURES.

Referring to FIGS. 3A–G, lower housing portion 106 is generally shown. Portion 106 comprises a generally rectangularly shaped member 144 having a lower bulging portion 146 and a flared outwardly portion 148, as is clearly shown in the FIGURES. Member 106 includes upwardly extending sides 150, 152 and ends 154, 156. A plurality of alignment slots 158 in sides 150, 152 and ends 154, 156 receive protrusions 140 of member 118 when the unit is assembled. A plurality of alignment protrusions 160 depend from sides 150, 152 and ends 154, 156. Protrusions 160 have a plurality of snap locking recesses 162 therein, which receive tabs 142 of member 118 when the unit is assembled. Also, a plurality of snap locking engagement tabs 164 extend inwardly from sides 150, 152 and ends 154, 156, which are received in recesses 143 of member 118 when the unit is assembled. Side 152 has a notch 166 therein for providing access to modular jack 114. Member 144 is bulged downwardly near notch 166 to provide sufficient clearance for modular jack 114. A loop 168 is defined at end 154 to provide attachment of the unit to a strap or the like, if so desired.

Referring to FIGS. 4A–E, cover 110 is generally shown. Cover 110 comprises a member 170 shaped to be received in stepped down portion of member 118. Member 170 includes sides 172, 174 and ends 176, 178. A snap locking tab 180 having an engagement ridge 182 depends from end 176 and is received in an opening 184 (FIG. 2C) in member 118 for holding cover 110 in its closed position (shown in FIGS. 1A–D). Member 170 further includes a protrusion 186 at side 172 for pushing against when opening cover 110. A button stem 188 is integrally defined in cover 110 for activating the unit. Button stem 188 comprises a button shaped upper portion 190, which is connected to member 170 by a thin connecting portion 192 circumferentially at the lower end of portion 190. Portion 192 allows button stem 188 to be urged downwardly when depressed. A stem portion 194 depends downwardly from the lower surface of portion 190 at about the center thereof. A snap locking cavity 196 is formed by a cylindrical wall 198 which depends downwardly from the lower surface of member 170. A retaining ridge 200 depends from wall 198 within cavity 196. Post 130 from upper housing portion 104 is received in cavity 196, whereby ridge 200 snaps into a recessed ring 202 (FIG. 2C) on post 130 pivotally retaining cover 110 on the housing. Cover 110 is preferably comprised of santoprene or other suitable material.

Figure 5C:
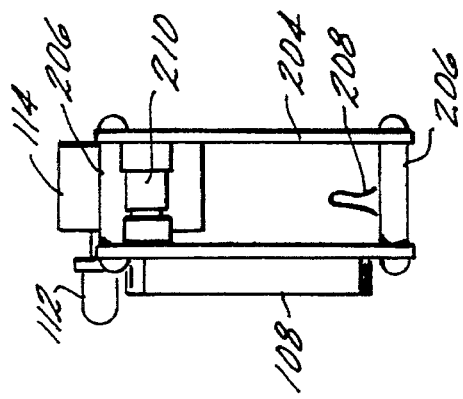
Figure 5A:
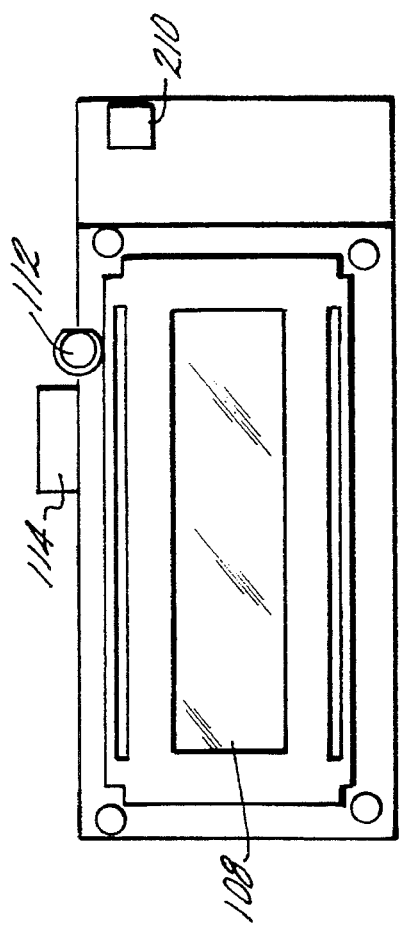
Figure 5B:
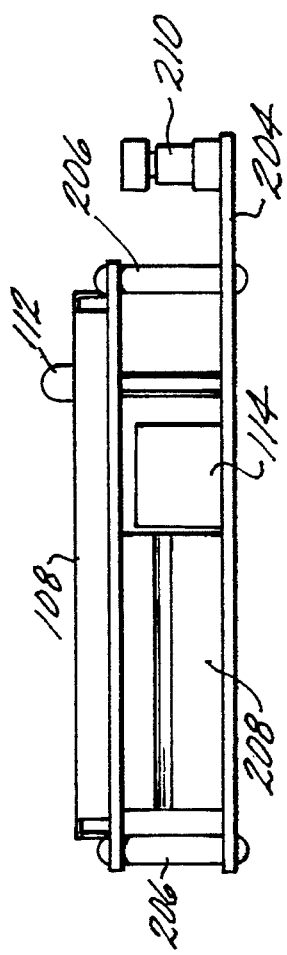

Referring to FIGS. 5A–C, the electronics of the unit are generally shown. A printed circuit board 204 has electronics mounted thereon which is described in more detail hereinafter. Display 108 is mounted to standoffs 206 which are attached to circuit board 204 for positioning display 108 in alignment with opening 120 when the unit is assembled. Display 108 is electrically connected to circuit board 204 by a flex-strip cable 208. Modular jack 114 and indicator 112 are also mounted to circuit board 204. An electronic switch 210 is mounted to circuit board and positioned to be actuated by depressing button stem 188 when the unit is assembled.

Figure 6A:
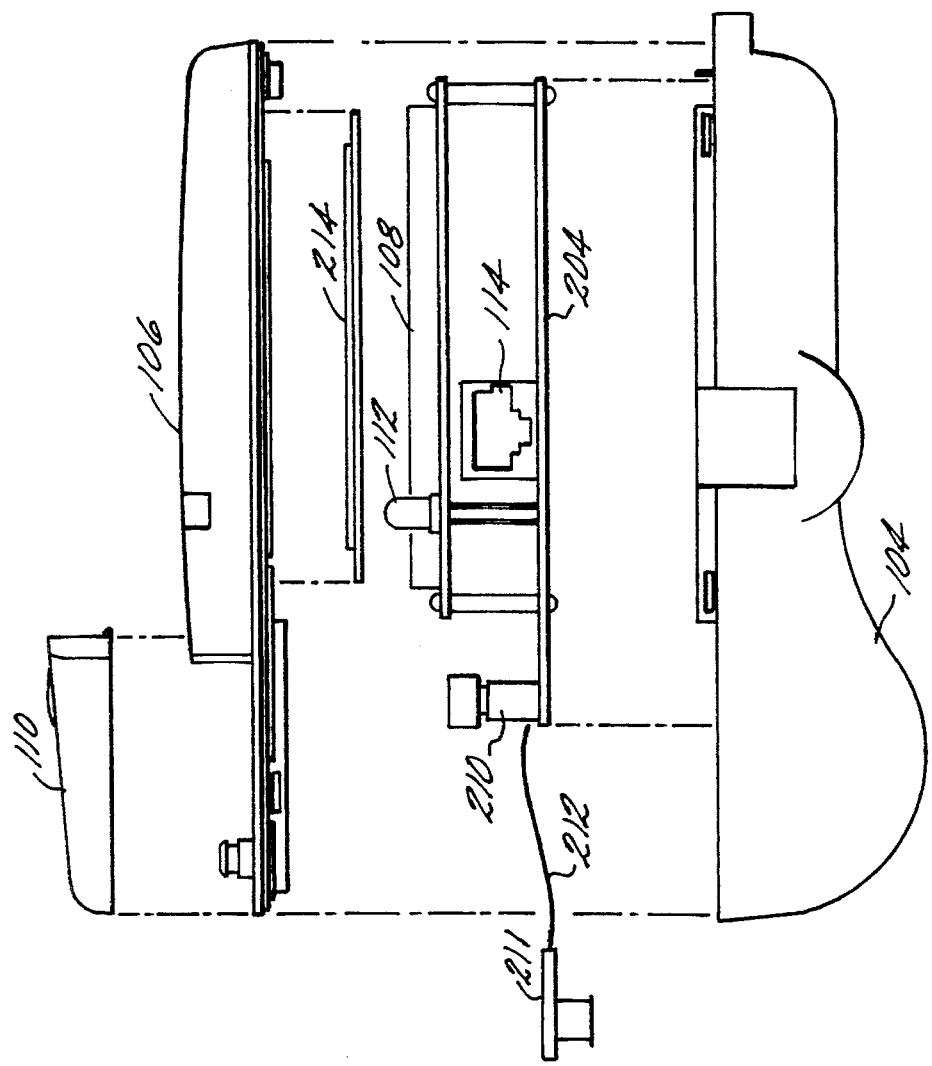
Figure 6B:
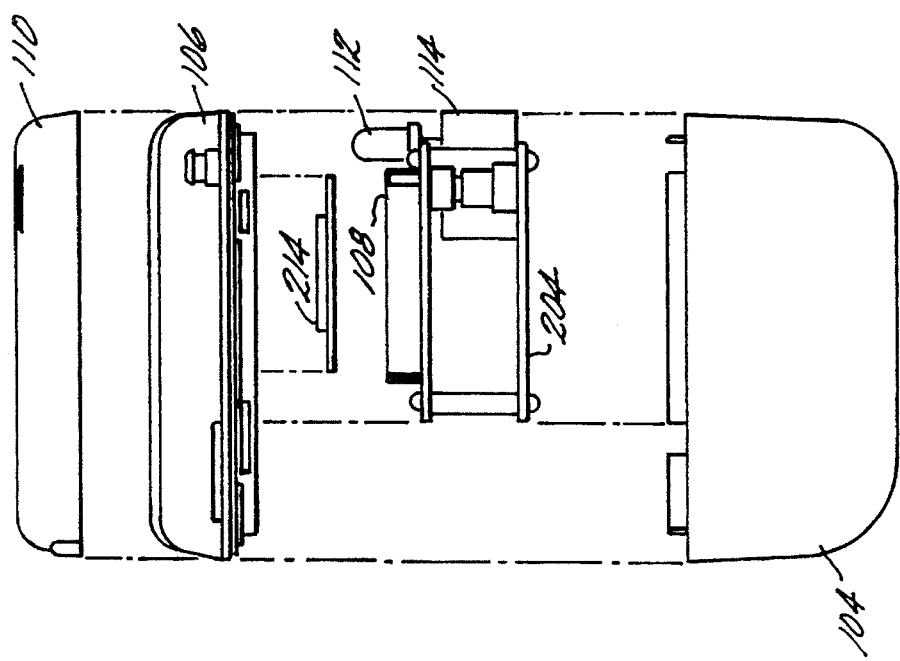

Referring to FIGS. 6A–B, exploded views of master control unit 100 are generally shown. A connector 211 for connection to a standard 9-volt battery is connected by a pair of wires 212 to circuit board 204. A transparent window 214 is disposed between display 108 and housing portion 106, which closely fits on opening 120 in housing portion 106.

Figure 7A:
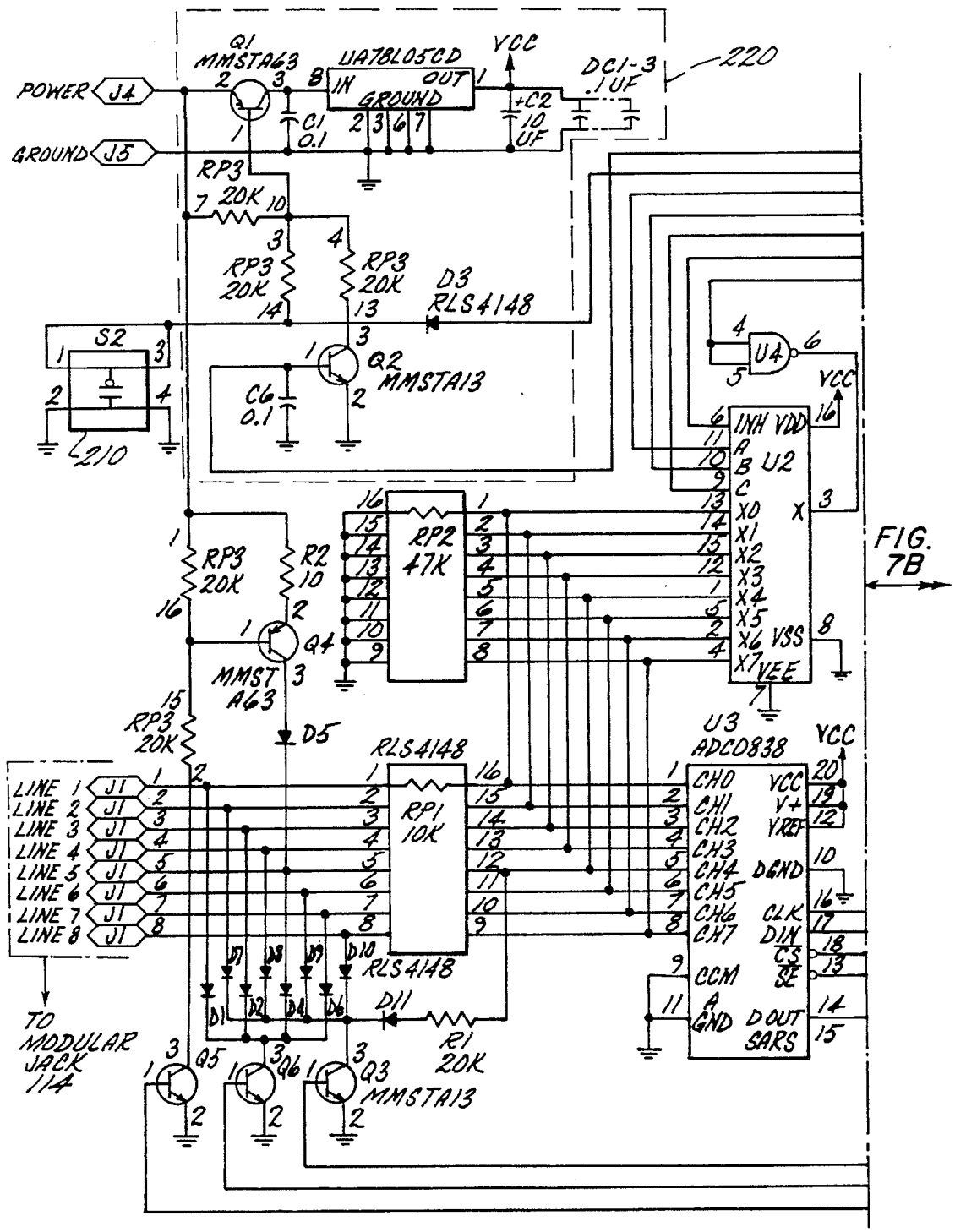
FIGS. 7A–B are electronic schematic diagrams for the electronics unit of FIGS. 5A–C.
Figure 7B:
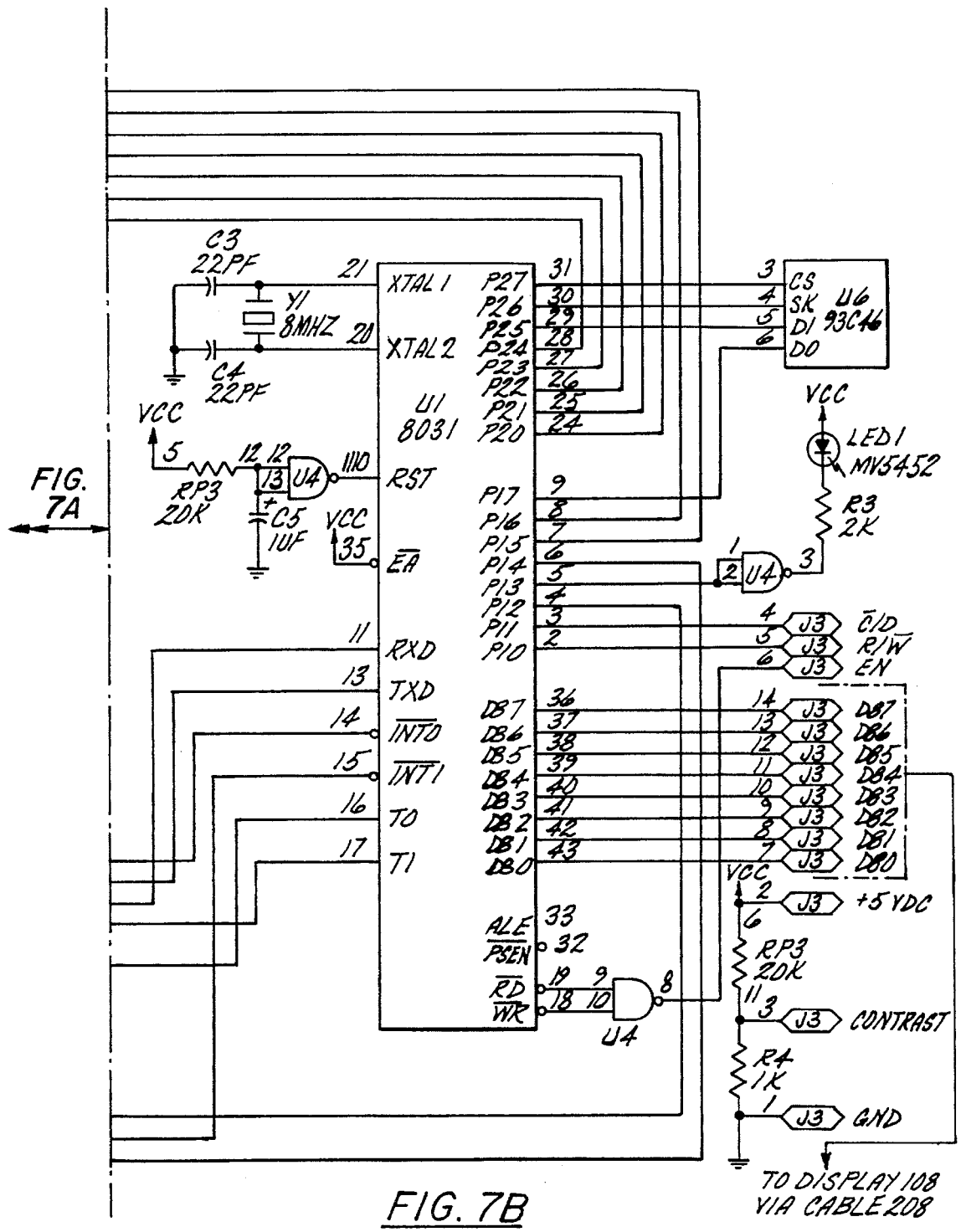
Figure 9C:
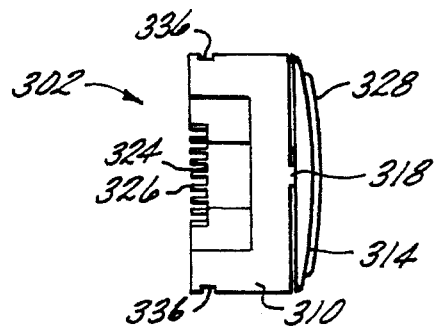
Figure 9D:
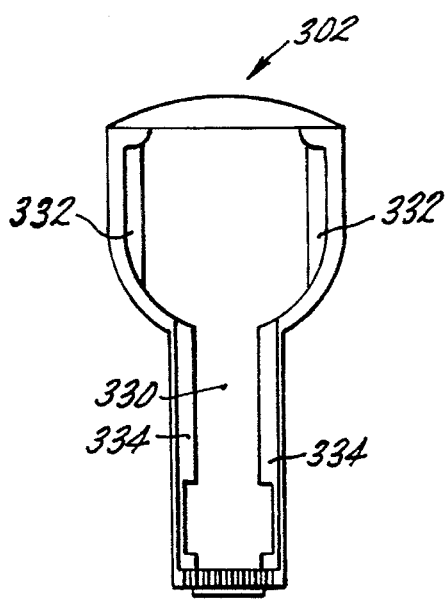
Figure 9B:
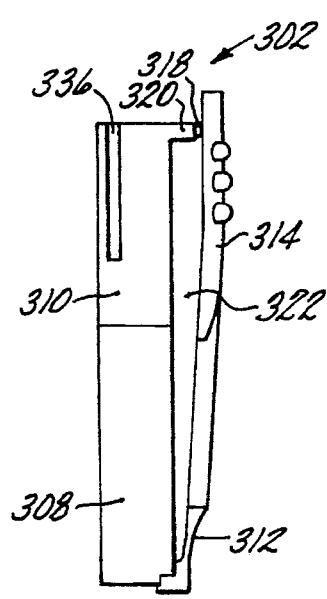
Figure 9A:
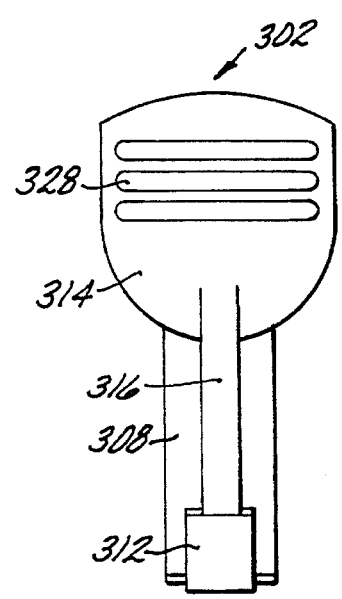
Figure 9E:
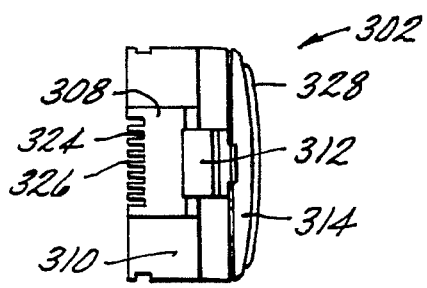
Figure 11D:
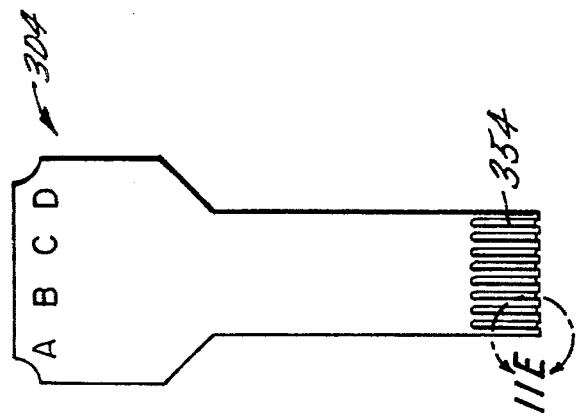
Figure 11E:
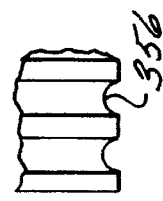
Figure 11C:
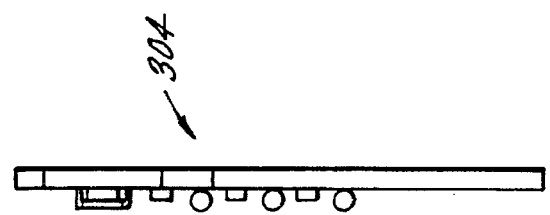
Figure 11A:
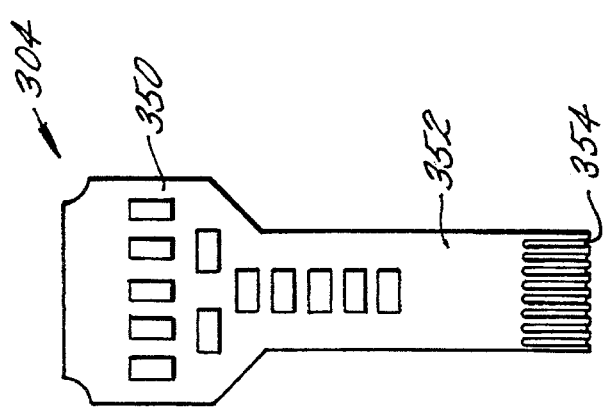
Figure 11B:
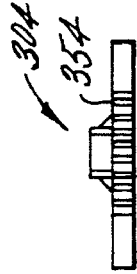

Referring to FIGS. 7A–B, a schematic diagram of the circuitry on circuit board 204 is generally shown. A circuitry block 220 applies power (i.e., +5 VDC) to master controller circuitry when switch 210 is actuated. Circuitry block 220 comprises transistors Q1 and Q2 for switching and a regulator U5 which converts +9 VDC battery power to +5 VDC for logic circuitry. An 8-bit microprocessor U1 provides for execution of self-contained software for controlling the master control unit. Nonvolatile memory storage U6 interfaces with microprocessor U1 to store the last selected test mode, which is the test mode the master control unit will power up in. A driver circuit U2 interfaces with microprocessor U1 for applying +5 VDC or ground to any of the pins of modular jack 114. Pins of modular jack 114 are pulled to ground by resistor pack RP2 and are isolated from line voltage by resistor pack RP1. An analog-to-digital (A/D) converter U3 converts the pin voltages collectively to a digital word which is presented to microprocessor U1. Transistor Q4 applies power to one of the pins (e.g., pin 5) of modular jack 114 for battery testing, to power external communications equipment, or to test for shielded cable. Transistors Q3 and Q6 supply ground returns for the tone modes.

Referring to FIGS. 8A–E, a remote unit compatible with standard modular jacks is shown generally at 300. Unit 300 comprises a housing 302 for supporting a printed circuit board 304 and a cover 306.

Referring to FIGS. 9A–E, housing 302 comprises an elongated generally rectangular portion 308 which is sized so as to be compatible with standard modular jacks. Depending from one end of portion 308 is an enlarged rounded portion 310 for gripping of unit 300 during insertion and removal from standard modular jacks. A latching tab 312 is mounted at one end of portion 308 for engaging the modular jack into which unit 300 is inserted during test. Tab 312 is released by depressing an enlarged rounded member 314 which matches portion 310 as it is disposed directly below (FIG. 9B) it. Member 314 is connected at one end thereof by a stem 316 to tab 312 and at the other end thereof to portion 310 by an stem 318. Member 314 is separated or spaced apart from portion 310 by a wall 320, whereby a space 322 is defined which allows member 314 to be depressed. A plurality of spaced apart channel 324 are defined by a plurality of spaced apart teeth 326 at the end of portion 308 which is inserted into the modular jack during testing. Channels 324 are sized and spaced for receiving contacts of a standard modular jack. A plurality of ridges 328 are formed at the outer surface of member 314 to facilitate gripping thereof during insertion and removal of unit 300. A cavity 330 is formed within housing 302, wherein a plurality of retaining ledges 332, 334 are defined for supporting circuit board 304. Also a pair of slots 336 are provided in portion 310 for retaining cover 306.

Referring to FIGS. 10A–G, cover 306 comprises a member 338 having a generally rounded shape conforming to portion 308 of housing 302. A pair of opposing side walls 340 depend upwardly from member 338 at the sides thereof and an end wall 342 depends upwardly from member 338 between walls 340. Walls 340 and 342 collectively form generally a U-shape leaving an opening 344 where portion 308 of housing 302 passes when cover 306 is disposed on housing 302. A pair of protrusions 346 depend inwardly from walls 340 and are received in slots 336 of housing 302 to retain cover 306 on housing 302. A plurality of ridges 348 may be formed at the outer surface of member 338 to facilitate gripping thereof during insertion and removal of unit 300.

Referring to FIG. 11A–E, circuit board 304 a first portion 350 which is tapered down to a second portion 352. Portion 350 is received in portion 310 of housing 302 and supported thereat on retaining ledges 332. Portion 352 is received in portion 308 of housing 302 and supported thereat on retaining ledges 334. Electronic components are mounted on circuit board 304 at one side thereof, which faces housing 302 when attached thereto, whereby electronic components are not exposed in the fully assembled unit 300. Circuit board 304 includes a plurality of contacts 354 which correspond in position (location) and number with channels 324 for receiving contacts of a standard modular jack. Contacts 354 are U-shaped and extend from one side of the circuit board 304 over the edge thereof to the other side thereof. The edge of circuit board 304 at contacts 354 include arcuate notches 356 for receiving contacts of a standard modular jack, where electrical connection between unit 300 and a modular jack under test is made.

Figure 12:
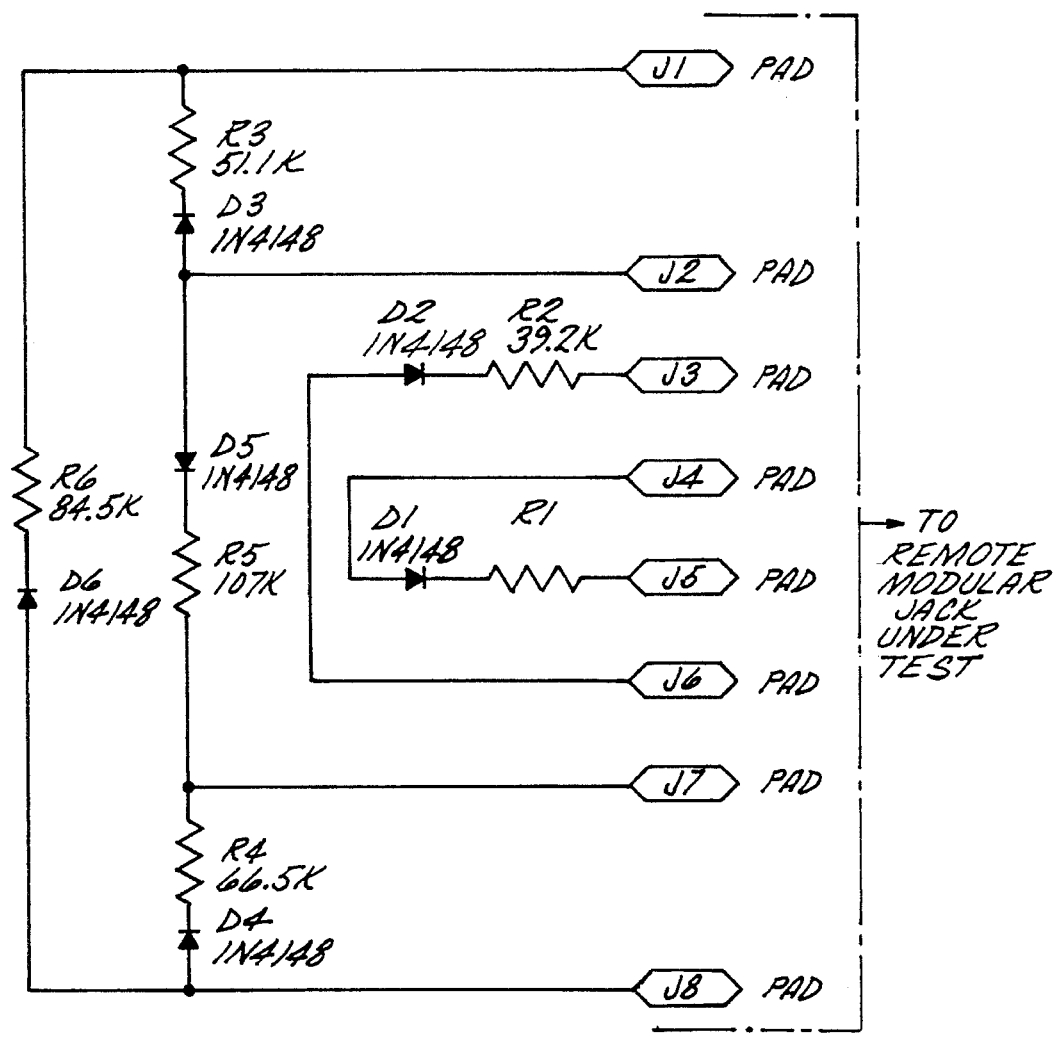
FIG. 12 is an electronic schematic diagram for the circuit board of FIGS. 11A–D.

Referring to FIG. 12, a schematic diagram of the circuitry on circuit board 304 is generally shown. Each wired pair is connected by a corresponding resistor and diode. The wired pairs are determined by the particular external wiring configuration. Unique resistor and diode values are used so that the master control unit can identify the remote unit connected thereto.

Figure 13:
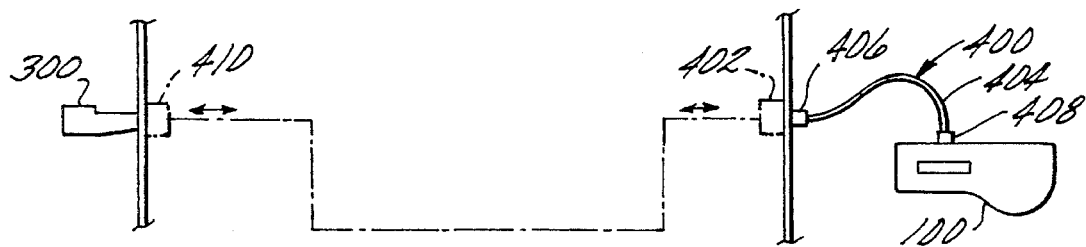
FIG. 13 is a diagrammatic view of the cable tester in use, in accordance with the present invention.

Referring to FIG. 13, during use master control unit 100 is connected by a jumper cable 400 to a modular jack 402 under test. Jumper cable 400 comprises a cable 404 having a plurality of conductors with modular plugs 406, 408 at each end thereof. Modular plug 406 is mated with modular jack 402 as is well known in the industry. Modular plug 408 is mated with modular jack 114 at master control unit 100. Modular jack 402 is connected by wiring to another modular jack 410 at another location. Remote unit 300 is inserted into and mates with modular jack 402. Testing is performed at master control unit 100. Both the master and remote units 100, 300 are capable of withstanding connection to active telephone voltage levels (i.e., 24–55 Vdc and/or 40–120 Vac at 17 to 33 Hz) without damage.

Master control unit 100 detects and displays (at display 108) a low battery condition (e.g., LOW BATT) and the presence of line voltage (e.g., alternately flashing LINE VOLTAGE). Master control unit 100 also detects the presence of a shielded cable and identifies the remote unit by applying a voltage to a pin and identifying a return voltage on another pin. Mode switch 116 is used to index through the test modes, described below. Further, to reduce wear on the switch and the time required to sequence through screens, the unit auto-repeats after being held down, e.g., for one second. Indicator 112 lights each time the button 116 is pushed, with each screen change, during testing, and remains lit to indicate a pass condition. The test modes are defined in the following table.

| | | | |
|---|---|---|---|
| | => | *OFF* | Manual off selection. |
| | ⇓ | | |
| | ⇑ | T568A | To test T568A wiring (4-pairs) |
| | ⇓ | | |
| | ⇑ | T568B | To test T568B wiring (4-pairs) |
| | ⇓ | | |
| Test | ⇑ | USOC | To test USOC wiring (1, 2, 3 or 4 pairs) |
| | ⇓ | | |
| | ⇑ | 10BASE-T | To test 10BASE-T wiring (2-pairs) |
| | ⇓ | | |
| | ⇑ | TOK-RING | To test Token Ring wiring (2-pairs) |
| | ⇓ | | |
| | ⇑ | TP-PMD | To test TP-PMD wiring (2-pairs) |
| | ⇓ | | |
| Find | ⇑ | FIND | To determine what wiring schemes is present. |
| | ⇓ | | |
| | ⇑ | TONE-1 | Tone on pin 1 |
| | ⇓ | | |
| | ⇑ | TONE-2 | Tone on pin 2 |
| | ⇓ | | |
| | ⇑ | TONE-3 | Tone on pin 3 |
| | ⇓ | | |
| Tone | ⇑ | TONE-4 | Tone on pin 4 |
| | ⇓ | | |
| | ⇑ | TONE-5 | Tone on pin 5 |
| | ⇓ | | |
| | ⇑ | TONE-6 | Tone on pin 6 |
| | ⇓ | | |
| | ⇑ | TONE-7 | Tone on pin 7 |
| | ⇓ | | |
| | ⇑ | TONE-8 | Tone on pin 8 |
| | ⇓ | | |
| Battery | <= | TALK BAT | +5 Volts on center two pins. |

The test mode can only be changed during display of a mode setting (e.g., T568A). After completion of a test mode, the unit pauses on the mode setting display, e.g., for one second, before continuing, allowing selection of an alternative mode. During a test, pressing button 116 will suspend the test sequence and hold the current display, pressing button 116 again will resume operation. Button 116 is also used to turn the master control unit on. Manual off is selected by button 116 as a display selection.

In Test and Find modes of operation, the master control unit operates continuously. The master control unit operates in four separate modes; Test (six settings), Find (one setting), Tone (eight settings) and Talk Bat (one setting), and can test 100-ohm balanced cables (i.e., DC resistance: 9.4 ohms per 100 meters; mutual capacitance: 6.6 pf per 100 meters), up to 800 meters in length. When one of the modes of operation is selected, the unit pauses, then commence operation. In the Test and Find modes the master control unit first identifies the remote unit attached at the far end then continues operation. In any other mode of operation, except for Find, if a test fails the DC portion, the master control unit will not continue with transmission testing. In the Find mode of operation the master control unit will perform transmission testing regardless of DC results.

A continuity test comprises applying a voltage (e.g., +5 VDC) to a pin of a pair and then reading the A/D converter to verify continuity. During the continuity test, the master control unit displays (at display 108) the current status of each pin, in sequence, with the following indications:

C=Continuity Pass. Pins under test are properly wired.
R=Reverse Polarity. Pins under test have a polarity reversal.
O=Open. Pin under test is not connected to the remote.
S=Short. Pin under test is shorted to another pair.
?=Miswire. Pin under test is wired to the incorrect pin or pins on the remote end. (e.g., pin-1 master wired to pin-2 two remote)

A transmission test looks for crosstalk by applying an AC signal to each of the pins (lines) and measuring AC coupling on each of the other pins (lines). During the transmission (i.e., cross talk) test, the master control unit displays the status of each pin in-sequence with the following indications.

X=Crossed Twists. Conductors under test are twisted to those of another pair.

For all wiring schemes, with the exception of USOC, if the test comes up with all 'C's and all 'T's, the master control unit will display PASS at the end of the test sequence. For USOC, a PASS indication is designated with either 1-PAIR, 2-PAIR, 3-PAIR, or 4-PAIR, provided that the wiring corresponds exactly to one of the four USOC schemes.

If the indications R, S, ? or X appear at any time during the test, the master control unit will display FAIL CNT or FAIL TRN at the end of the test sequence. An open wire will not necessarily lead to a FAIL indication when testing for USOC pair schemes. FAIL indications are displayed longer than PASS indications.

Once a PASS or FAIL indication appears, the master control unit automatically recycles, starting with an indication of the wiring scheme under test and pausing.

An example is provided below, where T568A is selected, with a remote unit configured with either T568A or T568B. In this example, a correctly wired 4-Pair USOC circuit in T568A mode, passes continuity tests, but fails transmission test for pairs 3 and

| Wiring Under Test | T568A | | | | | 4-Pair USOC | | | | |
|---|---|---|---|---|---|---|---|---|---|---|
| Test Mode | T568A <= | | | | | T568A <= | | | | |
| Plug Identity | REMOTE (A, B, C, D) | | | | | REMOTE (A, B, C, D) | | | | |
| Pair-1 Continuity | | | C | C | ⇑ | | C | C | | ⇑ |
| Pair-2 Continuity | | C | | C | ⇑ | | C | | C | ⇑ |
| Pair-3 Continuity | C | C | | | ⇑ | C | C | | | ⇑ |
| Pair-4 Continuity | | | | C | C ⇑ | | | | C | C ⇑ |
| Pair-1 Transmission | | | T | T | ⇑ | | T | T | | ⇑ |
| Pair-2 Transmission | | T | | T | ⇑ | | T | | T | ⇑ |
| Pair-3 Transmission | T | T | | | ⇑ | X | | | X | ⇑ |
| Pair-4 Transmission | | | | T | T ⇑ | | X | | | X ⇑ |
| Test Summary | PASS | | | | | => FAIL TRN | | | | => |

T=Transmission Pass. The pins under test are properly twisted for the wiring scheme selected.

The following table illustrates the differences in indication when a properly wired Token Ring circuit is checked in the following test modes:

| Test Operations | Token Ring | | | 10BASE-T | | | TPPMD | | | USOC | | |
|---|---|---|---|---|---|---|---|---|---|---|---|---|
| Test Mode | TOK-RING | | | 10BASE-T | | | TP-PMD | | | USOC | | |
| Plug Identity | REMOTE (A,B,C,D) | | | REMOTE (A,B,C,D) | | | REMOTE (A,B,C,D) | | | REMOTE (A,B,C,D) | | |
| Pair-1 Continuity | | C | C <= | O | O | <= | O | O | <= | | C | C <= |
| Pair-2 Continuity | C | | C ⇑ | C | C | ⇑ | O | O | ⇑ | C | | C ⇑ |
| Pair-3 Continuity | ⇓ | | ⇑ | ⇓ | | ⇑ | ⇓ | | ⇑ | | | ⇑ |
| Pair-4 Continuity | ⇓ | | ⇑ | ⇓ | | ⇑ | ⇓ | | ⇑ | | | ⇑ |
| Pair-1 Transmission | | T | T ⇑ | ⇓ | | ⇑ | ⇓ | | ⇑ | T | T | ⇑ |
| Pair-2 Transmission | T | | T ⇑ | ⇓ | | ⇑ | ⇓ | | T | | T | ⇑ |

-continued

| Test Operations | Token Ring | 10BASE-T | TPPMD | USOC | |
|---|---|---|---|---|---|
| Pair-3 Transmission | ⇓ | ⇑ ⇓ ⇑ | ⇓ ⇑ ⇓ | | ⇑ |
| Pair-4 Transmission | ⇓ | ⇑ ⇓ ⇑ | ⇓ ⇑ ⇓ | | ⇑ |
| Test Summary | PASS => | FAIL CNT => | FAIL CNT => | 2-PAIR/USOC => | |

When the wiring scheme under test is not known, the FIND mode is selected to determine which pair scheme a circuit under test is wired to. The FIND mode uses DC and transmission data to identify one of the following wiring schemes T568, 1-PAIR/USOC, 2-PAIR/USOC/TOK-RING, 3-PAIR/USOC or 4-PAIR/USOC, 10BASE-T and TP-PMD. Token ring (TOK-RING) is the same as 2-pair USOC (2-PAIR/USOC). DC and transmission testing is completed before a distinction between wiring schemes is made, e.g., transmission testing is completed before the master control unit can distinguish between 4-PAIR/USOC and T568.

If none of the standard wiring schemes is detected, but at least one of the six standard pairs (i.e., pins 4 & 5, 3 & 6, 1 & 2, 7 & 8, 2 & 7 or 1 & 8) is detected, the master control unit sequentially displays PNXX for each correctly wired pair grouping detected. If no standard pair grouping is detected (e.g., if continuity exists on pins 1 and 3 only), the master control unit displays NONE.

Several examples of the FIND mode operation are provided in the table below.

| Wiring | Token Ring | | 4-Pair USOC | | T568A | | Pins 3,6; 4,5; 7,8 | |
|---|---|---|---|---|---|---|---|---|
| Test mode | FIND | | FIND | | FIND | | FIND | |
| Plug Identity | REMOTE | | REMOTE | | REMOTE | | REMOTE | |
| | (A,B,C,D) | | (A,B,C,D) | | (A,B,C,D) | | (A,B,C,D) | |
| Summary 1 | T | T | T | T | T | T | T | T |
| Sum screen 2 | T | T | T | T | T | T | T T | |
| Sum screen 3 | 2-PAIR/ | | T | T | T | T | | T T |
| Sum screen 4 | USOC/ | | T | | T | T | PINS 3 6 | |
| Sum screen 5 | TOK-RING | | 4-PAIR | | T 5 6 8 | | PINS 4 5 | |
| Sum screen 6 | | | USOC | | | | PINS 7 8 | |
| Sum screen 7 | | | | | | | NONE | |

The master control unit will automatically power down after it has been idle for a period of time.

Operation of the TONE mode is by pin rather than by pair. The tone signal alternates between, e.g., 1500 Hz for 0.2 seconds and 800 Hz for 0.3 seconds with an output amplitude 5 Vp-p. The tone pin is changed by pressing switch 116.

The TALK BAT mode is used to provide a telephone circuit with voltage. Once voltage is supplied the telephone circuit may be used for communication.

While preferred embodiments have been shown and described, various modifications and substitutions may be made thereto without departing from the spirit and scope of the invention. Accordingly, it is to be understood that the present invention has been described by way of illustrations and not limitation.

What is claimed is:
1. A cable tester for testing a wiring scheme having a plurality of wires with a first connector at one end thereof and a second connector at another end thereof, said cable tester comprising:
  a master control unit comprising,
  (1) a first housing,
  (2) a third connector having a plurality of contacts, said third connector associated with said first housing, said third connector for interfacing with the first connector of the wiring scheme under test,
  (3) a first circuit for applying a first signal to said contacts of said third connector for testing continuity of the wires connected to the first connector in accordance with a selected test mode, said first circuit for applying a second signal to said contacts of said third connector for testing transmission of the wires connected to the first connector in accordance with said selected test mode, said first circuit disposed in said first housing,
  (4) a switch in communication with said first circuit for selecting said test mode, said switch disposed at said first housing, and
  (5) a display in communication with said first circuit for displaying test conditions, said display disposed at said first housing; and
  a remote unit comprising,
  (1) a second housing, one end of said second housing for interfacing with the second connector of the wiring scheme under test, and
  (2) a second circuit for interconnecting the wires connected to the second connector, said second circuit disposed at said second housing.
2. The cable tester of claim 1 wherein said first housing comprises:
  an upper housing portion having a first opening with said display disposed in said first housing and viewable through said first opening, said upper housing portion having a stepped down portion at one end thereof with a second opening through said stepped down portion for providing access for replacement of a battery;
  a cover disposed on said upper housing portion at said stepped down portion thereof, said cover being movable between an open position and a closed position; and
  a lower housing portion attached to said upper housing portion, said lower housing portion having a third opening with said third connector disposed at said housing and accessible at said third opening.

3. The cable tester of claim 2 wherein said first housing further comprises:

a button having a stem is integrally formed in said cover with said stem in close proximity to said switch when said cover is in the closed position, wherein pressing of said button actuates said switch.

4. The cable tester of claim 2 wherein said first housing further comprises:

a post extending upwardly from said stepped down portion; and said cover including a cavity with said post received in said cavity, whereby said cover is pivotally secured to said upper housing portion at said stepped down portion.

5. The cable tester of claim 1 wherein said third connector comprises a modular jack.

6. The cable tester of claim 1 further comprising:

a jumper cable having a fourth connector at one end thereof and a fifth connector at the other end thereof, said fourth connector for connecting to said third connector, and said fifth connector for connecting to the first connector.

7. The cable tester of claim 1 wherein said first circuit comprises:

a processor having a memory for storing signals indicative of a plurality of said test modes and initiating control signals in response to said selected test mode, said test mode being selected by actuation of said switch, said processor being responsive to detected signals and generating display signals, said display signals being presented to said display;

a first driver circuit responsive to said control signals for applying said first signal to said contacts of said third connector for testing continuity of the wires connected to the first connector in accordance with said selected test mode;

a second driver circuit responsive to said control signals for applying said second signal to said contacts of said third connector for testing transmission of the wires connected to the first connector in accordance with said selected test mode; and a detector circuit for detecting signals at said third connector and presenting said detected signals to said processor.

8. The cable tester of claim 1 wherein said display comprises a liquid crystal display.

9. The cable tester of claim 1 wherein said second housing includes a first end configured to be compatible with the second connector and a second opposing end comprising a gripping portion, said second housing including a cavity for supporting said second circuit.

10. The cable tester of claim 9 wherein the second connector is a modular jack.

11. The cable tester of claim 9 wherein:

said first end of said second housing is generally rectangular and includes a plurality of channels;

said second circuit comprises a circuit board having a plurality of contacts extending around one end of said circuit board, said circuit board being supported in said cavity of said second housing to align said contacts on said circuit board with said channels of said housing.

12. The cable tester of claim 11 further comprising:

a latching tab disposed at said first end of said second housing for releasably engaging the second connector; and a member having one end thereof attached to said latching tab and another end thereof attached to said gripping portion of said second housing with said member being spaced away from a remainder of said second housing, whereby pressing of said member releases said latching tab from the second connector when engaged therewith.

13. The cable tester of claim 9 wherein said second housing further includes:

a cover disposed at said second end of said second housing.

14. The cable tester of claim 1 wherein said test modes include T568A, T568B, USOC, 10BASE-T, TOK-RING, FIND, TONE-1, TONE-2, TONE-3, TONE-4, TONE-5, TONE-6, TONE-7, TONE-8 and TALK BAT.

15. The cable tester of claim 1 wherein said first signal comprises a DC voltage signal and a ground signal.

16. The cable tester of claim 1 wherein said second signal comprises an AC signal.

17. The cable tester of claim 1 further including an indicator for indicating activity of said cable tester.

18. A method of testing a wiring scheme having a plurality of wires with a first connector at one end thereof and a second connector at another end thereof, said method comprising the steps of:

connecting a third connector of a master control unit to the first connector of the wiring scheme under test, said third connector having a plurality of contacts;

connecting a remote unit to the second connector of the wiring scheme under test, selecting a test mode by actuating a switch on said master control unit;

applying a first signal to said contacts of said third connector for testing continuity of the wires connected to the first connector in accordance with a selected test mode, applying a second signal to said contacts of said third connector for testing transmission of the wires connected to the first connector in accordance with said selected test mode;

detecting signals at said third connector;

processing said detected signals to determine test results; and displaying said test results.

19. The method of claim 18 wherein said step of connecting said third connector of a master control unit comprises:

connecting a fourth connector at one end of a jumper cable to said third connector of said master control unit, and connecting a fifth connector at another end of said jumper cable to the first connector.

20. The method of claim 18 wherein:

said step of selecting said test mode comprises selecting from a plurality of said test modes stored in memory and initiating control signals in response to said selected test mode;

said step of applying said first signal being responsive to said control signals;

said step of applying said second signal being responsive to said control signals.

21. The method of claim 18 wherein said test modes include T568A, T568B, USOC, 10BASE-T, TOK-RING, FIND, TONE-1, TONE-2, TONE-3, TONE-4, TONE-5, TONE-6, TONE-7, TONE-8 and TALK BAT.

22. The method of claim 18 wherein said first signal comprises a DC voltage signal and a ground signal.

23. The method of claim 18 wherein said second signal comprises an AC signal.

24. The method of claim 18 wherein said step of selecting said test mode includes auto-incrementing of the test modes.

25. The method of claim 18 further including the step of:
indicating activity of said cable tester.

26. A connector for electrically mating with a connecting device having a plurality of contacts, said connector comprising:
a connector housing, one end of said connector housing being mechanically matable with the connecting device and including a plurality of channels therein; and
a circuit board having a plurality of contacts thereon, said circuit board supported by said connector housing to align said contacts on said circuit board with said channels of said connector housing, wherein said contacts on said circuit board are electrically matable with the contacts of the connecting device.

27. The connector of claim 26 wherein said contacts comprise:
a plurality of circuit traces on said circuit board.

28. The connector of claim 27 wherein said circuit traces extend from one surface of said circuit board around one end of said circuit board to another opposing surface of said circuit board.

29. The connector of claim 26 wherein:
said circuit board further comprises said one end thereof having a plurality of notches therein; and
said contacts comprise a plurality of circuit traces on said circuit board within said notches.

30. The connector of claim 26 wherein said connector further comprises:
a latching tab disposed at said one end of said connector housing for releasably engaging said connector with the connecting device; and
a member having one end thereon attached to said latching tab, wherein pressing of said member releases said latching tab from the connecting device when engaged therewith.

31. A connector for electrically mating with a connecting device having a plurality of contacts, said connector comprising:
a connector housing, one end of said connector housing having a plurality of channels therein; and
a circuit board having a plurality of contacts thereon, said circuit board supported by said connector housing to align said contacts on said circuit board with said channels of said connector housing, wherein said contacts on said circuit board are electrically matable with the contacts of the connecting device.

32. The connector of claim 31 wherein said contacts comprise:
a plurality of circuit traces on said circuit board.

33. The connector of claim 32 wherein said circuit traces extend from one surface of said circuit board around one end of said circuit board to another opposing surface of said circuit board.

34. The connector of claim 31 wherein:
said circuit board further comprises said one end thereof having a plurality of notches therein; and
said contacts comprise a plurality of circuit traces on said circuit board within said notches.

35. The connector of claim 31 wherein said connector further comprises:

a latching tab disposed at said one end of said connector housing for releasably engaging said connector with the connecting device; and
a member having one end thereon attached to said latching tab, wherein pressing of said member releases said latching tab from the connecting device when engaged therewith.

36. A connector for electrically mating with a connecting device having a plurality of contacts, said connector comprising:
a connector housing, one end of said connector housing being mechanically matable with the connecting device and including a plurality of channels therein; and
a circuit board having a plurality of circuit traces extending from one surface of said circuit board around one end of said circuit board to another opposing surface of said circuit board, said circuit board supported by said connector housing to align said circuit traces at said one end of said circuit board with said channels of said connector housing, wherein said circuit traces at said one end of said circuit board are electrically matable with the contacts of the connecting device.

37. The connector of claim 36 wherein:
said circuit board further comprises said one end thereof having a plurality of notches therein with said circuit traces at said one end of said circuit board disposed in said notches.

38. The connector of claim 36 wherein said connector further comprises:
a latching tab disposed at said one end of said connector housing for releasably engaging said connector with the connecting device; and
a member having one end thereon attached to said latching tab, wherein pressing of said member releases said latching tab from the connecting device when engaged therewith.

39. A connector for electrically mating with a connecting device having a plurality of contacts, said connector comprising:
a connector housing, one end of said connector housing having a plurality of channels therein; and
a circuit board having a plurality of circuit traces extending from one surface of said circuit board around one end of said circuit board to another opposing surface of said circuit board, said circuit board supported by said connector housing to align said circuit traces at said one end of said circuit board with said channels of said connector housing, wherein said circuit traces at said one end of said circuit board are electrically matable with the contacts of the connecting device.

40. The connector of claim 39 wherein:
said circuit board further comprises said one end thereof having a plurality of notches therein with said circuit traces at said one end of said circuit board disposed in said notches.

41. The connector of claim 39 wherein said connector further comprises:
a latching tab disposed at said one end of said connector housing for releasably engaging said connector with the connecting device; and
a member having one end thereon attached to said latching tab, wherein pressing of said member releases said latching tab from the connecting device when engaged therewith.

* * * * *